United States Patent [19]

Frazier et al.

[11] Patent Number: 5,646,418
[45] Date of Patent: Jul. 8, 1997

[54] QUANTUM EFFECT SWITCHING DEVICE

[75] Inventors: Gary A. Frazier, Garland; James H. Luscombe, Dallas, both of Tex.

[73] Assignee: Texas Instruments Incorporated, Dallas, Tex.

[21] Appl. No.: 933,974

[22] Filed: Aug. 24, 1992

Related U.S. Application Data

[63] Continuation of Ser. No. 608,509, Nov. 2, 1990, abandoned.

[51] Int. Cl.$^6$ .............................. H01L 47/00; H01L 29/06
[52] U.S. Cl. ......................... 257/4; 257/12; 257/16
[58] Field of Search ............................. 357/4, 12, 16

[56] References Cited

U.S. PATENT DOCUMENTS

| | | | |
|---|---|---|---|
| 4,758,870 | 7/1988 | Hase et al. | 357/16 |
| 4,912,531 | 3/1990 | Reed et al. | 357/4 |
| 5,023,671 | 6/1991 | DiVincenzo et al. | 357/4 |

FOREIGN PATENT DOCUMENTS 226383  6/1987  European Pat. Off. .

OTHER PUBLICATIONS

Seabaugh, IEEE Trans on Electron Devices, vol. 36, No. 10, Oct. 1989, pp. 2328–2334.
Broekaert et al, Applied Physics Letters vol. 53, No. 16, 17 Oct. 1988, pp. 1545–1547.

*Primary Examiner*—Mahshid D. Saadat
*Assistant Examiner*—Jhihan B. Clark
*Attorney, Agent, or Firm*—Carlton H. Hoel; W. James Brady; Richard L. Donaldson

[57] ABSTRACT

A quantum effect switching device comprising a substrate 12, first and second tunnel barriers 14 and 18, and a quantum well 16. The current between a drain region 20 and the substrate 12 can be switched by placing a potential on a gate layer 24. The potential on the gate layer 24 selectively modulates the effective dimensions of the quantum well 16 to alter the allowed energy levels within the conduction band of the quantum well 16.

13 Claims, 7 Drawing Sheets

QUANTUM EFFECT SWITCHING DEVICE

This application is a continuation of application Ser. No. 07/608,509, filed Nov. 2, 1990, now abandoned.

TECHNICAL FIELD OF THE INVENTION

This invention relates in general to the field of electronic devices and more particularly an improved quantum effect switching device.

BACKGROUND OF THE INVENTION

Integrated circuits have become the technology of choice for performing electronic functions. The downscaling of minimum device geometries has provided for increases in the functional density of electronic circuits. The development of nanoelectronic devices has allowed for the continuing increase in functional density of integrated electronic systems beyond the currently perceived limits for conventional electron devices. The term "nanoelectronics" refers to an integrated circuit technology which permits downscaling of minimum circuit geometries to on the order of 0.01 microns.

Physical principles by which conventional transistors operate are no longer utilized at the nanoelectronic size scale. In this range of dimensions, the behavior of electrons in semiconductors can no longer be understood by thinking of electrons as particles, but the wave-like nature of electrons must be invoked. Device physicists call this the "quantum regime" and it requires a different mathematical description of electron behavior. The most important quantum phenomena for the development of quantum devices is the ability of an electron to "tunnel" through a potential energy barrier, rather than having to go over it as would a classical particle. Another important quantum phenomenon is quantum size effects or confinement effects. If an electron moving through a semiconductor is thought of as a Bloch wave, a quantum well within a device can be structured to have a dimension less than the coherence length of the Bloch wave involved. At the characteristic length scales, the electrons can then resonate due to the constructive interference of forward and backward Bloch waves, and steady state tunneling current is substantially reinforced, like the sound from a resonating organ pipe. These quantum confinement effects can be observed in an electronic device when a dimension of a structure within the device is on the order of 100 Angstroms. The device is thus said to provide charge carrier quantization in the particular dimension.

When a dimension of a semiconductor region within a quantum device reaches approximately 100 Angstroms, the conduction band characteristics change. In an ordinary semiconductor structure having conventional geometries of substantially greater than 100 Angstroms, the conduction band contains a continuous spectrum of possible energy levels for electrons to occupy. As quantum size effects or confinement effects become apparent, this continuous spectrum of energy levels divides into defined subbands of allowed energies with gaps separating the subbands. The principles of a resonant tunneling diode use these allowed energy bands to switch current on and off by adjusting the bias across the quantum well.

The energy subbands and gaps will appear if a single dimension of the quantum well is on the order of 100 Angstroms. If two dimensions of the quantum well are on the order of 100 Angstroms with the third dimension being substantially greater than 100 Angstroms, the device is commonly referred to as a quantum wire. The quantum wire will have narrower and different subbands than the quantum well which has only a single quantized dimension. If all three dimensions of the quantum well are on the order of 100 Angstroms or less, the quantum well is commonly referred to as a quantum dot structure. In a quantum dot structure, the energy subbands will further subdivide and become discrete energy states.

Prior art quantum devices have used quantum wells having defined dimensions and have created diode structures which will change conduction characteristics as the bias voltage across the quantum wells is altered. While these designs can produce efficient and highly conductive devices, these devices do not operate in a similar manner to the traditional three terminal switching device such as the common field effect transistor. Accordingly, a need has arisen for a quantum effect device which utilizes the change in the energy levels of the conduction band through the effective dimensional modulation of the quantum well of the device to provide a three terminal switching device.

SUMMARY OF THE INVENTION

In accordance with the teachings of the present invention, a quantum effect switching device is provided which comprises a quantum well which has at least one dimension sufficiently small such that quantum confinement affects manifest themselves in the conduction band associated with the quantum well. The quantum well is thus said to be quantized in this dimension. The device of the present invention further comprises a gate body disposed proximate a portion of the quantum well. In operation, a potential placed on the gate body is operable to affect the quantization of a selected one of the dimensions of the quantum well by electrically dimensionally modulating the selected dimension of the quantum well.

According to one specific embodiment of the present invention, the potential placed on the gate body is operable to increase the carrier confinement associated with that selected dimension of the quantum well by electrically decreasing the effective size of the quantum well in the selected dimension.

According to another embodiment of the present invention, the potential placed on the gate body is operable to decrease the quantization of the selected dimension of the quantum well by electrically increasing the effective size of the quantum well in the selected dimension.

An important technical advantage of the switching device of the present invention inheres in the fact that through the use of dimensional modulation, quantum confinement effects can be used to provide an extremely efficient switching function. The switching function is realized in a three terminal device having extremely small minimum device geometries.

BRIEF DESCRIPTION OF THE DRAWINGS

A more complete understanding of the present invention may be acquired by referring to the detailed description and claims when considered in connection with the accompanying drawings in which like reference numbers indicate like features and wherein:

FIG. 5b is graphical illustration showing the energy levels during operation of the device illustrated in FIG. 5a;

FIG. 5c is a further graphical illustration showing the drain current versus the gate voltage during operation of the device shown in FIG. 5a;

DETAILED DESCRIPTION OF THE INVENTION

Figure 1A:
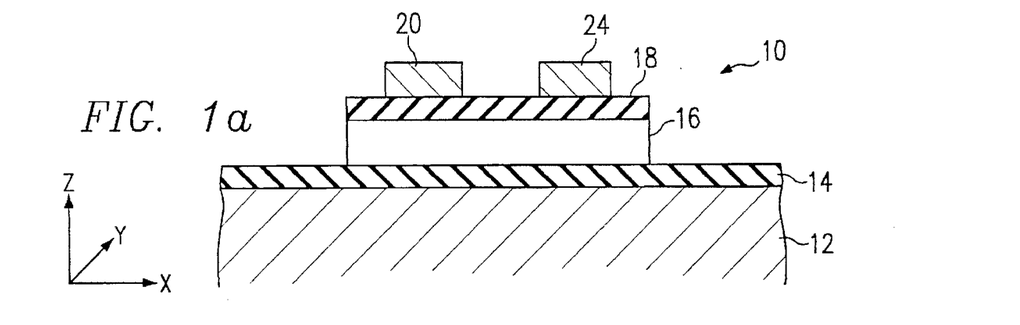
FIGS. 1a through 1g are elevational cross-sectional diagrams of different embodiments of three terminal quantum devices constructed according to the teachings of the present invention.

FIG. 1a is a cross-sectional illustration of a quantum effect device 10 which is constructed on an outer surface of a conductive substrate 12. Substrate 12 may comprise a conductive layer produced outwardly from an insulating mechanical substrate. A first tunnel barrier layer 14 is constructed on an outer surface of substrate 12. Substrate 12 may comprise single crystalline gallium arsenide doped so as to be rendered conductive. First tunnel barrier layer 14 may comprise an epitaxially grown layer of lattice matching aluminum gallium arsenide [$Al_xGa_{1-x}As$]. It should be understood that the selection of gallium arsenide and aluminum gallium arsenide in all the embodiments described herein is merely for the purpose of teaching the present invention and should not be construed to limit the present invention to these or any particular materials. For example, other suitable semiconductor materials such as silicon and other suitable tunnel barrier materials could be substituted for the materials described herein without departing from the intended scope of the present invention. Tunnel barrier layer 14 may be advantageously grown according to known methods to be on the order of 50 Angstroms in thickness. A quantum well layer 16 is epitaxially grown on the outer surface of tunnel barrier layer 14. Quantum well layer 16 may comprise a layer of intrinsic gallium arsenide epitaxially grown to a thickness on the order of 100 Angstroms. A second tunnel barrier layer 18 may then be epitaxially grown on an outer surface of quantum well layer 16. Second tunnel barrier layer 18 may comprise a second layer of aluminum gallium arsenide epitaxially grown on the order of 50 Angstroms in thickness. A drain layer 20 is formed outwardly from second tunnel barrier layer 18 and may comprise any suitable conductor formed using conventional methods employing, for example, electron beam lithography.

At this point, it should be noted that the epitaxial structure formed by first and second tunnel barrier layers 14 and 18 and quantum well 16 comprises together with drain 20 and substrate 12 a resonant tunneling diode. The structure affects carrier quantization in the z direction as shown in FIG. 1 as the quantum well 16 is only 100 Angstroms in thickness. Accordingly, quantum or confinement effects will be demonstrated in the z direction and the conduction band of the device will demonstrate energy subbands separated by gaps of disallowed energy levels. By adjusting the voltage between the drain 20 and the substrate 12, the resonant tunneling diode can be selectively caused to conduct or not conduct in the z direction.

A quantum device constructed according to the teachings of the present invention is formed by adding to the resonant tunneling diode a gate conductor 24 disposed adjacent second tunnel barrier layer 18. If the width in the x direction as shown in FIG. 1 of the quantum well 16 is on the order 400 Angstroms, dimensional modulation can be used to create a three terminal switching device by selectively introducing quantum confinement effects in the x direction. In effect, the placing of a potential on gate conductor 24 can selectively quantize the quantum well 16 in the x direction as well as the z direction. This additional degree of electron confinement will cause a change in the conduction band characteristics of the device and can be used to create a switching capability without adjusting the bias voltage between drain layer 20 and the substrate 12.

Figure 1B:
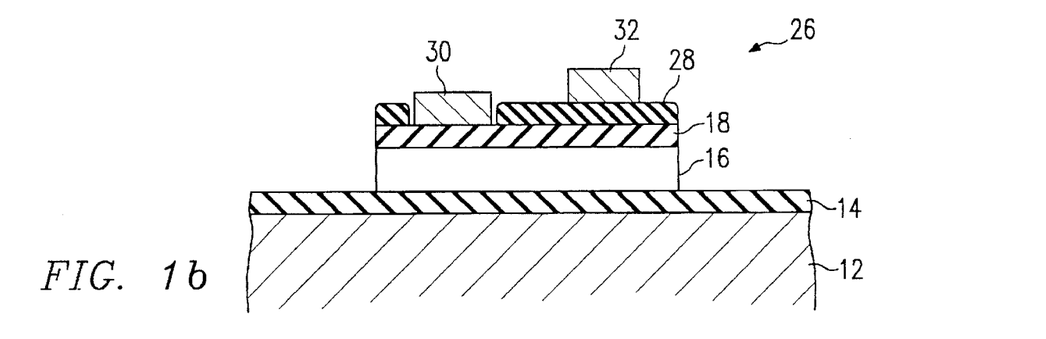

FIG. 1a illustrates only one embodiment of quantum effect device 10 where drain conductor 20 and gate conductor 24 are disposed directly adjacent second tunnel barrier layer 18. FIG. 1b illustrates a quantum effect device 26 which is identical to quantum effect device 10 through the formation of second tunnel barrier layer 18. At this point, a gate insulator layer 28 is formed outwardly from second tunnel barrier layer 18. Gate insulator layer 28 may comprise, for example, on the order of 200 Angstroms of widegap undoped insulator material such as silicon nitride or oxide. An opening is then formed in gate insulator layer 28 using lithographic processes and a drain contact 30 is formed in the opening. A gate contact 32 is formed outwardly from gate insulator layer 28. The operation of device 26 differs from the operation of device 10 in that gate contact 32 comprises a substantially higher impedance contact than drain contact 30. In this manner, the input resistance of the gate contact of device 26 can be high and still provide the quantum effect switching operations discussed previously with reference to device 10.

It should be understood that device 26 is presented merely for the purposes of teaching one method of forming drain and gate contacts having differing input impedances. A variety of other methods could be used to accomplish the same device characteristics. For example, layer 18 could be formed to be of variable thickness such that layer 18 is substantially thicker inwardly from the gate contact than the drain contact. According to another embodiment, layer 18 could remain of substantially constant thickness and the contacts could be formed using doped semiconductor material. The gate contact could incorporate a graded dopant level to provide for the insulative effects described previously.

Figure 1C:
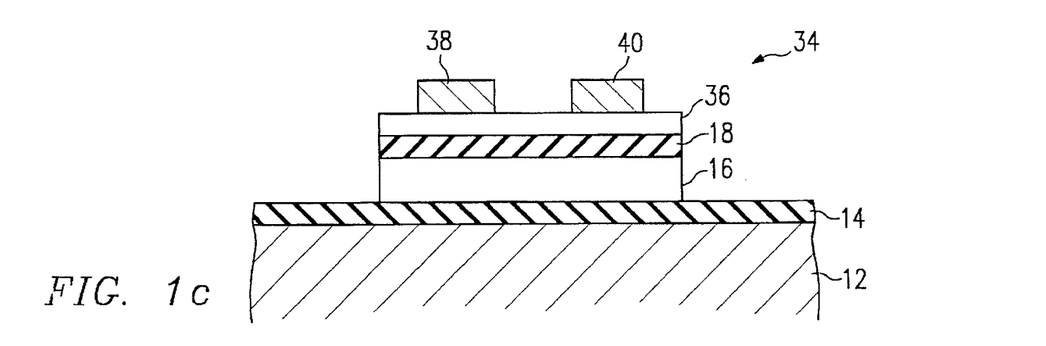

FIG. 1c illustrates a quantum effect device 34 which incorporates a layer of N+ semiconductor material 36 formed outwardly from second tunnel barrier layer 18. Layer 36 may comprise, for example, on the order of 500 Angstroms of N+ gallium arsenide which is grown through molecular beam or conventional epitaxial processes. A drain contact 38 and a gate contact 40 may then be formed outwardly from layer 36. The incorporation of layer 36 allows for the formation of contacts 38 and 40 to form either ohmic or Schottky contact through the use of conventional processes. In this manner, gate contact 40 may be selectively made to be either a high or low impedance contact. Layer 36 will provide some current flow between gate contact 40 and drain contact 38. This current flow can be regulated by adjusting the sheet resistance of layer 36.

Figure 1D:
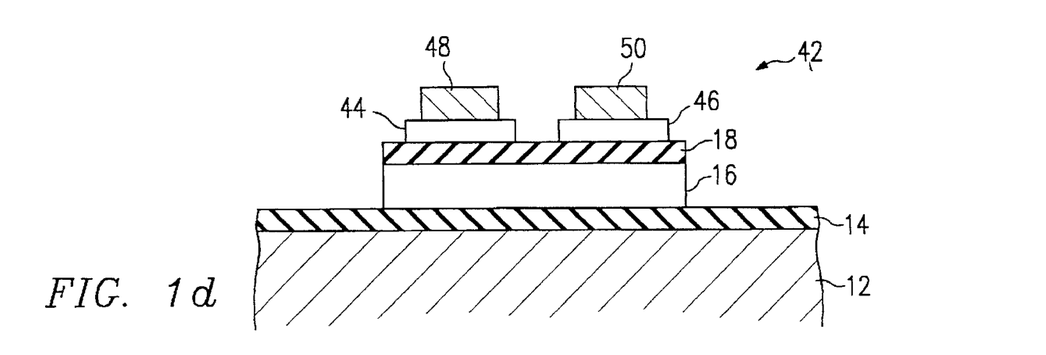

If complete isolation is desired between the gate and drain contacts of a device, a device such as device 42 illustrated in FIG. 1d may be constructed. Device 42 incorporates a separate drain layer 44 and gate layer 46 which are each formed from a single layer of N+ semiconductor material such as layer 36 discussed previously. An etchant step can be used to isolate layer 44 from layer 46 after the formation of the single layer. A drain contact 48 and a gate contact 50 can then be formed outwardly from layer 44 and layer 46, respectively. In this manner, contacts 48 and 50 can be made to be either ohmic or Schottky contacts and the current flow between contacts 48 and 50 can be substantially reduced.

Figure 1E:
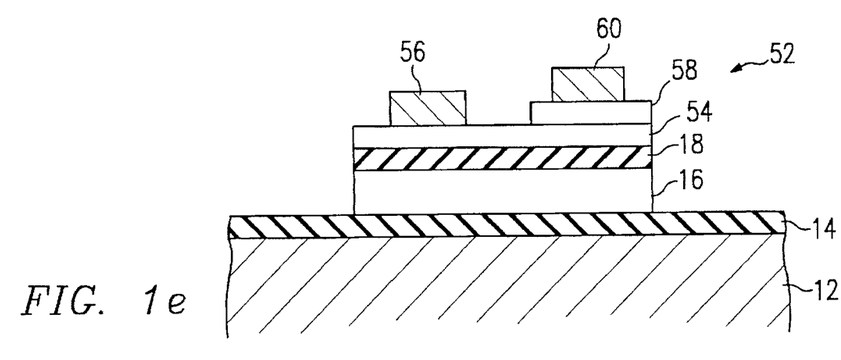

Referring to FIG. 1e, a quantum effect device 52 is illustrated which illustrates still another method of isolating the drain and gate contacts of the switching device. Referring to FIG. 1e, a layer 54 is formed outwardly from second tunnel barrier layer 18. Layer 54 is substantially identical to layer 36 discussed with reference to FIG. 1c and device 34 previously. Layer 54 may comprise, for example, on the order of 500 Angstroms of N+ semiconductor material such as gallium arsenide. A drain contact 56 is disposed outwardly from a portion of layer 54 and may be formed in either ohmic or Schottky contact with layer 54 using conventional methods depending upon the required impedance of the drain contact of device 52. A layer 58 is formed outwardly from a second portion of layer 54. Layer 58 may comprise, for example, on the order of 500 Angstroms of P+ semiconductor materials such as gallium arsenide. A gate contact 60 is then formed outwardly from layer 58. The interface between layer 58 and layer 54 forms a P-N junction. By placing a bias voltage between the substrate 12 and gate contact 60, the P-N junction formed by layer 58 and 54 can be reversed biased. This reversed bias P-N junction will provide the necessary isolation of the gate contact 60 from the drain contact 56.

Figure 1F:
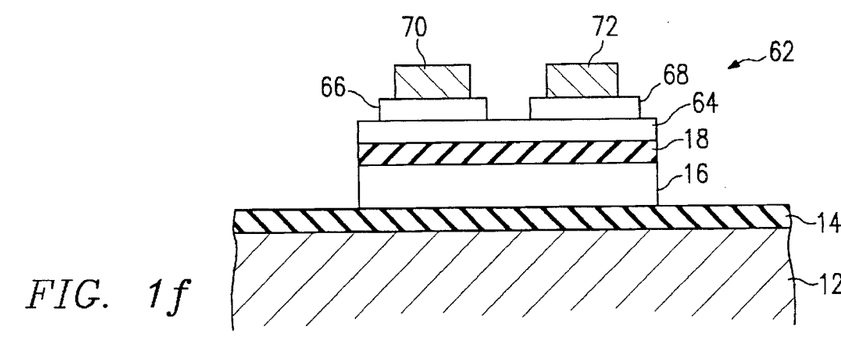

Referring to FIG. 1f, a quantum effect device 62 is illustrated which is an extension of the techniques used to construct device 52 discussed previously. Referring to FIG. 1f, a layer 64 substantially identical to layer 54 discussed previously is formed outwardly from second tunnel barrier layer 18. A drain layer 66 and a gate layer 68 are then formed outwardly from layer 64. Layers 66 and 68 both may comprise, for example, P+ semiconductor materials such as gallium arsenide formed to a thickness on the order of 500 Angstroms. Each of layers 66 and 68 are substantially identical to layer 58 discussed previously with reference to FIG. 1e and device 52. A drain contact 70 is formed outwardly from drain layer 66 and a gate contact 72 is formed outwardly from gate layer 68. Two independent P-N junctions are formed between layer 66 and layer 64 and layer 68 and layer 64 respectively. Either ohmic or Schottky contacts can be formed selectively between contact 70 and layer 66 and between contact 72 and layer 68. The P-N junction between layer 68 and 64 can be reversed bias by placing an appropriate voltage between contact 72 and substrate 12. Similarly, the P-N junction formed between drain layer 66 and layer 64 can be forward biased by placing an appropriate voltage between the drain contact 70 and the substrate 12. Due to the inherent symmetry of the device 62, either P-N junction can be forward or reversed bias selectively by placing an appropriate bias voltage between this particular contact and the substrate 12. In this manner, the drain and gate contacts may be isolated from one another and provide for either low impedance or high impedance input into the device 62 depending upon the bias voltage applied to the particular contact.

Figure 1G:
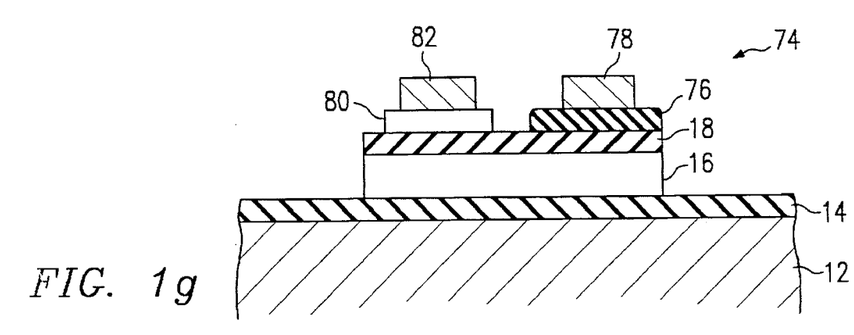

FIG. 1g illustrates a device 74 which combines several of the techniques discussed previously. A gate insulator layer 76 is formed outwardly from a portion of second tunnel barrier layer 18. A gate contact 78 is formed outwardly from gate insulator layer 76. Gate insulator layer 76 is similar to gate insulator layer 28 discussed with reference to device 26 in FIG. 1b. Gate insulator layer 76 may comprise, for example, on the order of 200 Angstroms of widegap undoped insulator material such as silicon nitride or oxide. A drain layer 80 is formed outwardly from a second portion of second tunnel barrier layer 18. Drain layer 80 may comprise on the order of 500 Angstroms of N+ semiconductor material such as gallium arsenide. A drain contact 82 is formed outwardly from drain layer 80. Due to the incorporation of drain layer 80, drain contact 82 may be formed as either a high impedance Schottky or a low impedance ohmic contact using conventional techniques. Gate contact 78 is insulatively isolated from the remainder of device 74 by the gate oxide layer 76 and therefore forms a high impedance contact.

It should be understood that the embodiments illustrated by FIGS. 1a through 1g are merely shown for purposes of teaching important technical advantages of the present invention and should not be construed to limit the teachings of the present invention to these or any embodiments. Depending upon the required device characteristics, any combination of the techniques discussed with reference to FIGS. 1a through 1g could be utilized in association with a quantum effect device utilizing dimensional modulation. These other combinations are intended to be included within the scope of the present invention.

Figure 2A:
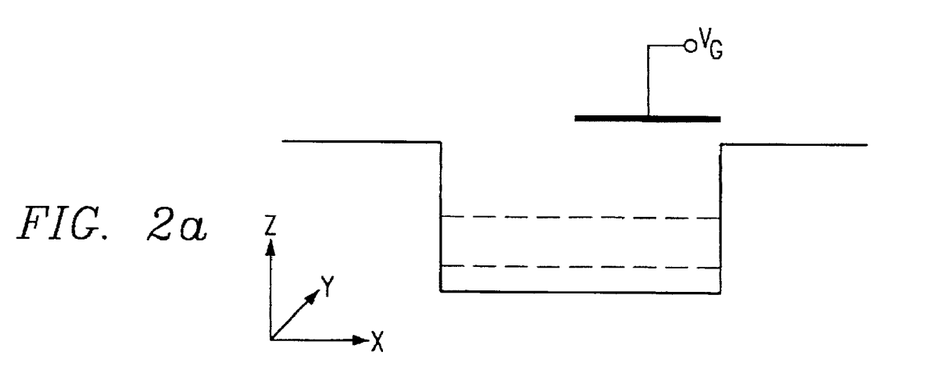
FIGS. 2a through 2c are graphical illustrations of the electronic conduction band potential of a device constructed according to the teachings of the present invention.
Figure 2B:
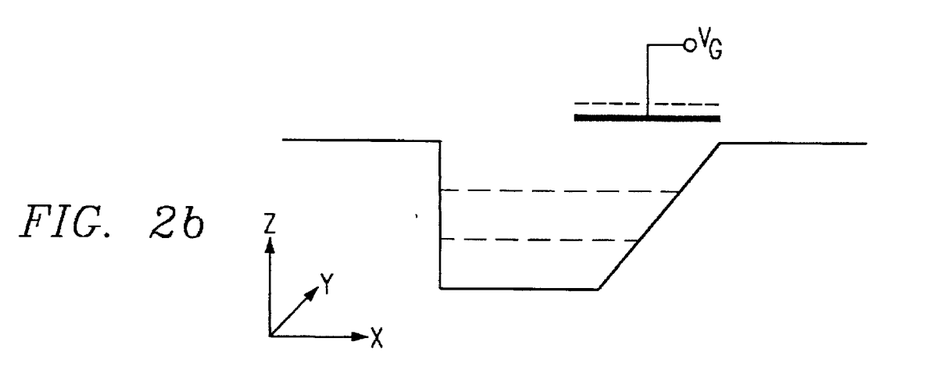
Figure 2C:
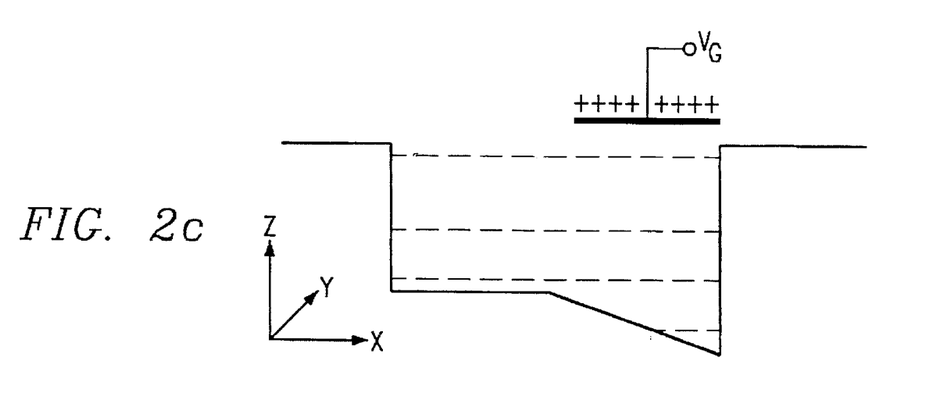

FIGS. 2a through 2c illustrate the changes in the conduction band during the operation of the quantum device 10. Similar changes would be seen during the operation of devices 26, 34, 42, 52, 62 and 74. FIG. 2a illustrates the conduction band characteristics when there is no gate voltage, $V_G$ present on gate 24. The dashed lines are intended to illustrate the subband minima of allowed energies within the quantum well. The solid line is intended to illustrate the potential energy profile created by the quantum well 16 and the tunnel barrier layers 14 and 18. According to the known operation of quantum wells, an electron attempting to pass through the quantum well 16 must have an energy level within one of the subbands for it to tunnel across the quantum well 16.

FIG. 2b shows the conduction band diagram when a negative gate voltage is placed on gate 24. This negative gate voltage has the effect of depleting the region of quantum well 16 proximate the gate 24 and effectively quantizing the electron states in the quantum well 16 in the x direction. This process is referred to as dimensional modulation in that the effective dimensional characteristics of the quantum well are changed electrically as opposed to physically. In effect, the quantum well 16 is electrically changed from a quantum well to a quantum wire by the placement of a potential on the gate 24. This dimensional modulation causes the conduction band characteristics to change and the allowed energies to shift.

FIG. 2c illustrates the conduction band diagram when a positive gate voltage is placed on gate 24. In this case, the confinement effects within quantum well 16 are reduced and a new lower energy level is created in the quantum well. Depending upon the resonant energy level created by the bias voltage between the drain 20 and the substrate 12, the alteration of the allowed energies across the quantum well 16 by third terminal action of gate at 24 can be used to create a highly efficient switching device. FIGS. 1 and 2 therefore illustrate a method by which a quantum well which effects election quantization quantized in a single dimension can be dimensionally modulated to produce quantization in two dimensions.

Figure 3:
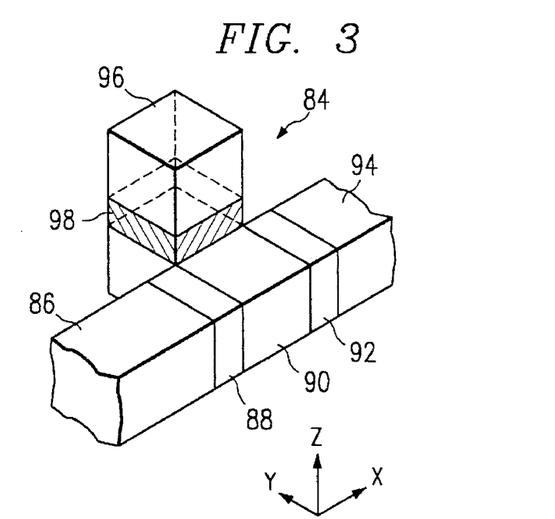
FIG. 3 is a top level schematic illustration of one embodiment of a quantum device constructed according to the teachings of the present invention.

FIG. 3 is a schematic illustration of a logical extension of the dimensional modulation method discussed with reference to FIGS. 1 and 2. FIG. 3 is a single embodiment of a device which uses dimensional modulation to change a quantum well which is constructed as a quantum wire into a quantum dot. In other words, the device in FIG. 3 has the ability to dimensionally modulate a device from two dimensions of confinement to three dimensions of confinement.

Referring to FIG. 3, a quantum effect device 84 is illustrated which comprises a source 86 which may comprise heavily doped N+ type gallium arsenide. A first tunnel barrier 88 is formed adjacent source area 86. First tunnel barrier 88 may comprise, for example, aluminum gallium arsenide. First tunnel barrier 88 is formed to be on the order of 50 Angstroms in width in the x dimension, 100 Angstroms in depth in the y dimension and 100 Angstroms in height in the z dimension. A quantum well 90 is formed adjacent first tunnel barrier 88 and may comprise, for example, intrinsic gallium arsenide. Quantum well 90 may be formed to be on the order of 100 Angstroms in width in the x direction, 100 Angstroms in height in the z direction and 200 Angstroms in depth in the y direction. A second tunnel barrier 92 is formed adjacent quantum well 90 on the opposite side of quantum well 90 from first tunnel barrier 88. Second tunnel barrier 92 may be formed of aluminum gallium arsenide and may have substantially identical dimensions as first tunnel barrier 88. A drain 94 is placed adjacent second tunnel barrier 92 and may comprise highly doped N+ gallium arsenide. A gate 96 comprising a suitable conductive material is insulated from a portion of quantum well 90 by a gate insulator layer 98. Gate insulator layer 98 may comprise a suitable insulative material such as oxide and may be formed on the order of 50 to 100 Angstroms in thickness in the z direction.

It should be understood that the various techniques described with reference to FIGS. 1a through 1g which may be used to form a variety of high impedance or low impedance contacts to the quantum effect devices 10, 26, 34, 42, 52, 62 and 74 may be similarly applied to device 84.

In operation, a potential placed on gate 96 can deplete the region of quantum well 90 proximate the gate insulator 98. This depletion will effectively confine carrier in quantum well 90 in three dimensions by reducing the effective dimension of quantum well 90 in the y direction to on the order of 100 Angstroms. This dimensional modulation of quantum well 90 will cause an alteration of the configuration of the energy levels within the conduction band through quantum well 90. Accordingly, a switching function can be implemented by changing the energy levels within the conduction band in and out of the resonant tunneling mode.

It should be understood that while the terminology source, drain and gate are being used to describe device 84 for purposes of convenience, the physical properties used to create the switching function within device 84 are quite different from those associated with traditional field effect devices. The depletion of the portion of quantum well 90 is not being used to lower or raise a potential barrier to either enhance or pinch off a flow of electric charge through the quantum well 90 as would be the case with a traditional field effect transistor. In comparison, the potential on gate 96 is used to modulate the allowed energies of the electrons tunneling through the portion of quantum well 90 proximate tunneling barriers 88 and 92. Accordingly, through the use of a potential placed on gate 96, the quantum well 90 is electrically changed from a quantum well quantized in two dimensions to a quantum well which is quantized in three dimensions. The operation of device 84 electronically changes a quantum wire with its associated conduction band characteristics to a quantum dot structure with its associated conduction band characteristics.

Figure 4:
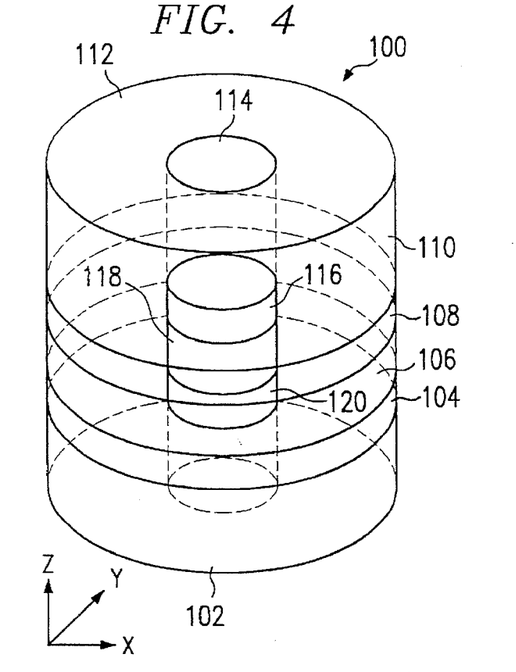
FIG. 4 is a schematic illustration of one embodiment of a quantum dot structure constructed according to the teachings of the present invention.

FIG. 4 is a schematic illustration of a structure which can be used to create a quantum dot device using what are called surface depletion effects. A quantum device 100 illustrated in FIG. 4 may be formed by epitaxially growing a source layer 102 of heavily doped N+ type gallium arsenide. A first tunnel barrier layer 104 of aluminum gallium arsenide on the order of 50 Angstroms in thickness may then be epitaxially grown on an outer surface of source layer 102. A quantum well layer 106 of intrinsic gallium arsenide may then be epitaxially grown to a thickness on the order of 100 Angstroms on an outer surface of layer 104. A second tunnel barrier layer 108 comprising aluminum gallium arsenide may then be epitaxially grown to a thickness on the order of 50 Angstroms on an outer surface of quantum well layer 106. A drain layer 110 is epitaxially grown on an outer surface of layer 108 and may comprise heavily doped N+ gallium arsenide. The entire structure of layers 102 through 110 is then patterned and anistropically etched to form a column 112 on the order of one tenth of a micron in diameter. Due to the crystalline and electrical characteristics of the outer surface of the column 112, surface depletion effects will deplete the carriers in all but a small cylinder 114 through the center of column 112. The effective diameter of cylinder 114 can be adjusted by adjusting the doping levels used to form layers 102 through 110. By carefully controlling these doping layers, the diameter undepleted carrier channel of cylinder 114 can be made to be on the order of 50 Angstroms. This dimension is small enough so that quantum effects will take place in a small area at the center of device 100. Accordingly, through the operation of the surface depletion effects, a first tunnel barrier 116, a quantum well 118 and second tunnel barrier 120 are formed at the center of column 112 in cylinder 114. Quantum well 118 comprises an extremely small cylinder of gallium arsenide having a diameter on the order of 50 Angstroms and a height on the order of 100 Angstroms. This cylinder comprises a quantum dot structure as all three dimensions of the cylinder are within the range required for quantum effects to take place.

Figure 5A:
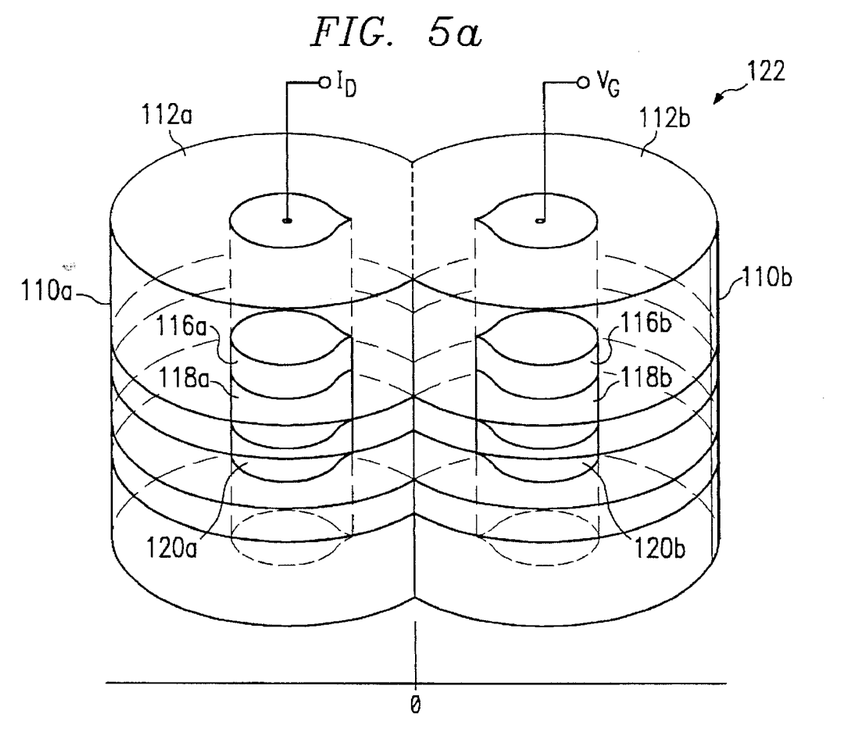
FIG. 5a is a schematic illustration of one embodiment of a quantum effect device constructed according to the teachings of the present invention.

A switching device using dimensional modulation can be constructed by positioning two of the devices shown in FIG. 4 proximate one another. FIG. 5a illustrates such a device. The processes used to form a quantum device 122 illustrated in FIG. 5a are substantially identical to those described with reference to quantum device 100 in FIG. 4. The only difference is that following the formation of the epitaxial layers, the anisotropic etch process creates a dumbbell or figure "8" shape comprising two joined cylinders 112a and 112b each having first tunnel barriers 116a and 116b, quantum wells 118a and 118b and second tunnel barriers 120a and 120b. The operation of device 122 uses dimensional modulation to selectively electronically couple the quantum wells 118a and 118b shown in FIG. 5a. By placing a gate potential $V_G$ on the drain region 110b of column 112b, the quantum wells 118a and 118b can be electronically changed from isolated quantum dots to a configuration which is electrically joined and which exhibits a conduction band analogous to a quantum wire. Drain region 110b thereby functions as the "gate" of device 122.

The techniques described with reference to FIGS. 1a through 1g in order to isolate a drain contact from a gate contact can be equally applied to the device 122 illustrated in FIG. 5a. Device 122 is illustrated in FIG. 5a to already comprise a layer of heavily doped N+ semiconductor material such as gallium arsenide which is embodied in regions 110a and 110b. This layer of heavily doped gallium arsenide would correspond to, for example, layer 36 discussed with reference to device 34 in FIG. 1c. As described with reference to FIGS. 1a through 1g, this layer is optional depending upon the desired device characteristics required. One possible methodology for forming the contacts necessary for the operation of device 122 and other similar embodiments of the present invention is fully described in application Ser. No. 07/608,406, filed concurrently herewith by Mr. John Randall, assigned to the Assignee of the present application and entitled "Method of Forming a Quantum Effect Switching Device", the disclosure of which is incorporated herein by reference.

Figure 5B:
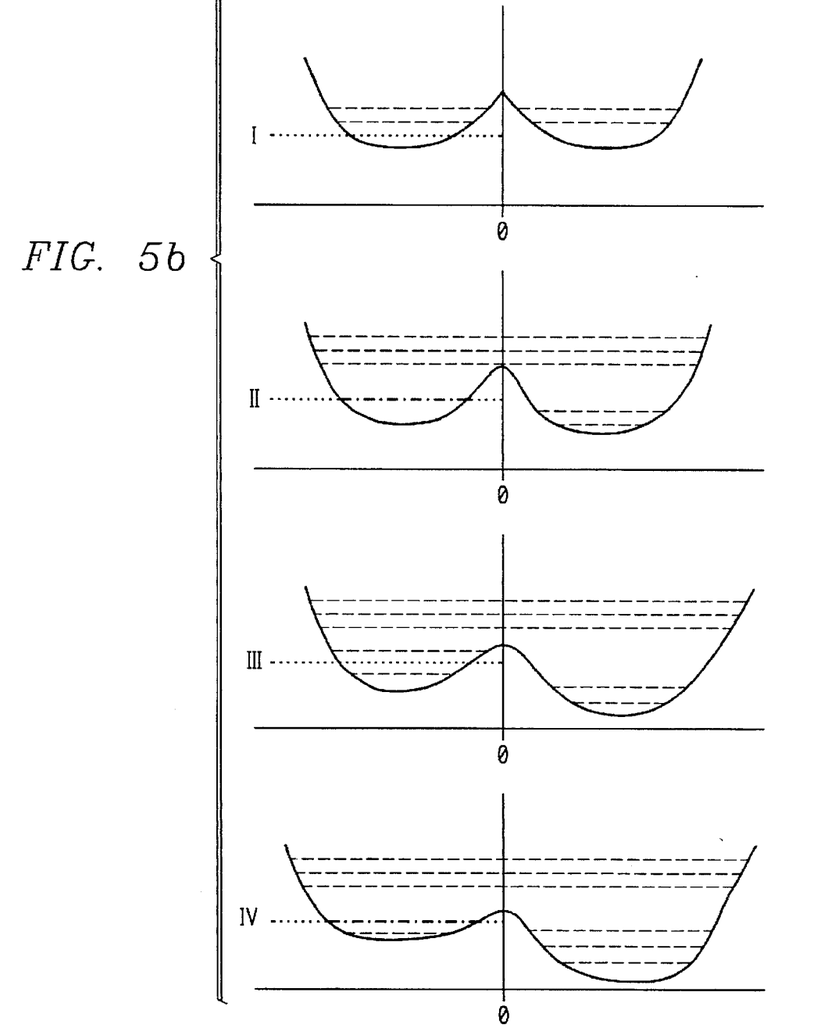
Figure 5C:
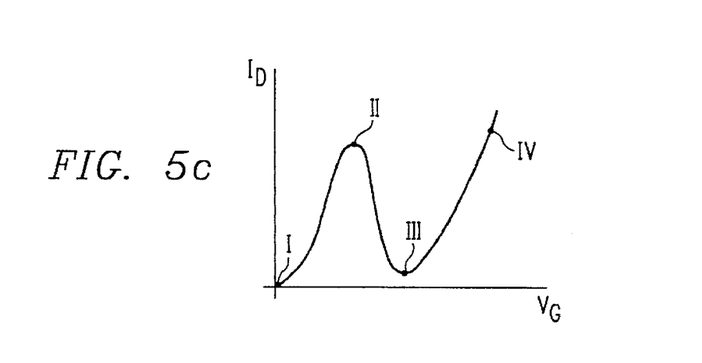

FIG. 5c illustrated the alteration which can be made in the drain current, $I_D$, flowing between the drain and source regions of column 112a by altering the gate voltage $V_G$ on the drain region 110b of column 112b. FIG. 5b comprises graphical illustrations of the conduction bands associated with the operation of device 122. FIG. 5c is a graph demonstrating the relationship of the drain current, $I_D$, to the gate voltage, $V_G$. The conduction bands left of the zero mark illustrate the characteristics of quantum well 118a while the conduction bands right of the zero mark illustrate the energy levels within the conduction band of quantum well 118b. In state I, quantum wells 118a and 118b are isolated from one another as no gate voltage has been placed on the source region of column 112b. Referring to FIG. 5c, state I is shown as having no gate voltage and no drain current. The dashed lines in FIG. 5b state I are intended to indicate allowed energy levels of electrons within quantum wells 118a and 118b. The dotted line is intended to illustrate a hypothetical resonant tunneling level through quantum well 118a.

In state II in FIGS. 5b and 5c, a gate voltage has been placed on the source region of column 112b and the conduction band characteristics of quantum well 118a have been changed such that an allowed energy level and the resonant tunneling level coincide. As such, as can be seen in FIG. 5c, a current $I_D$ will flow through quantum well 118a.

In state III shown in FIGS. 5b and 5c, the further increase in the gate voltage has caused the allowed energy levels within the conduction band to not coincide with the resonant tunneling level and as such, the current $I_D$ significantly drops.

In state IV, the further increase in the gate voltage again allows for an energy level to coincide with the resonant tunneling level and once again, a high current $I_D$ flows through quantum well 118a. Accordingly, the device 112 uses dimensional modulation to reduce the quantum confinement in one dimension to change two separate quantum dots into an electrically linked quantum wire structure. This change in the quantization characteristics of the structure corresponds to an alteration of the allowed energy levels associated with the device. This alteration in the allowed energy levels can be used to provide a switching function in a three terminal quantum effect device.

Figure 6:
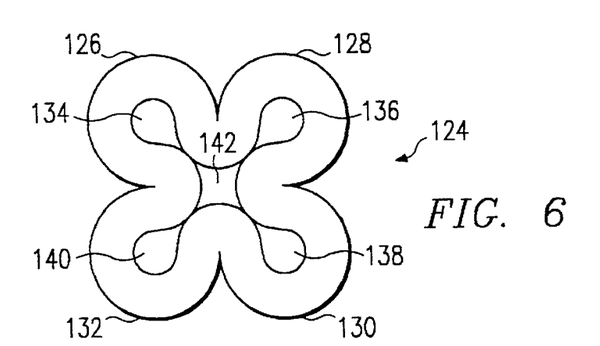
FIG. 6 is a top view diagram of a quantum effect logic device constructed according to teachings of the present invention.

Referring to FIG. 6, a quantum effect logic device 124 is illustrated. Device 124 represents an extension of the concepts embodied in device 122. FIG. 6 represents a cross-sectional top view of a six terminal logic device which utilizes quantum effects to perform a 4 input AND function. Device 124 represents a structure which fuses four of the column structures illustrated in FIG. 4 with reference to device 100. Columns 126, 128, 130 and 132 each have a quantum dot structure 134, 136, 138 and 140 placed at the center of the respective columns. Quantum dot structures 134, 136, 138 and 140 are formed through the surface depletion effects discussed previously. The same surface depletion effects form a quantum "star" structure 142 at the center of device 124. Each of quantum dots 134, 136, 138, 140 and quantum star 142 comprise the epitaxially formed heterostructure of two tunnel barriers surrounding a quantum well of intrinsic semiconductor material described previously with reference to FIG. 5a. Individual contact can be made to each of quantum dots 134, 136, 138, 140 and quantum star 142 in a similar manner as was made to the separate quantum dot devices in device 122 described previously.

In operation, device 124 can be designed to function as a logic device by adjusting the conduction band characteristics of each of the regions 134 through 142 such that a voltage must be placed on each of the regions 134, 136, 138 and 140 before current will flow through region 142. This has the effect of forming a four input AND gate function. It should be noted that device 124 is presented solely for the purposes of teaching the concept of extending the dimensional modulation technique to logical devices. A variety of alterations could be made to the embodiment shown in FIG. 6 without departing from the spirit and scope of the present invention. For example, the number of columns comprising device 124 is shown purely for the purpose of teaching an important technical advantage of the present invention. For example, a three column device could be used to form a two or three input AND gate function depending upon the relative placement of the three columns and whether or not a central quantum region is formed by surface depletion effects. Further, the presentation of circular columns is presented solely as a matter of convenience. A variety of other shapes could conceivably be utilized to capitalize on the operation of surface depletion effects to form quantum effect regions within a particular device. Further, while each of columns 126 through 132 and device 134 are shown to be of equivalent sizes, this also is presented solely as a matter of convenience. Depending upon the required device characteristics, asymmetrical devices may be used and are intended to be included within the scope of the teachings of the present invention.

An important technical advantage of the teachings of the present invention inheres in the fact that, through the use of dimensional modulation, extremely complex logical functions can be embodied in single nanoelectronic devices. These devices themselves can be integrated through the use of local interconnect architectures in order to perform functionality traditionally reserved for large scale integrated circuits. Additionally, the ability of an electronic structure to modulate the conduction patterns of a neighboring structure through the use of dimensional modulation and quantum effects is directly applicable to the development of cellular automata structures. It should be understood that these and other applications of the discrete devices disclosed herein are intended to be included within the teachings of the present invention.

The embodiments described previously with reference to FIGS. 1 through 6 utilize the concept of dimensional modulation to alter the conduction patterns of quantum wells which are already size-quantized in at least one dimension. As described previously, this is accomplished by placing a potential on a gate conductor which is proximate the quantum well such that the effective size of the quantum well is electrically altered. The concept of dimensional modulation can be extended, however, to electrically create size-quantized regions from intrinsic semiconductor material which is not quantized in any dimension.

Figure 7A:
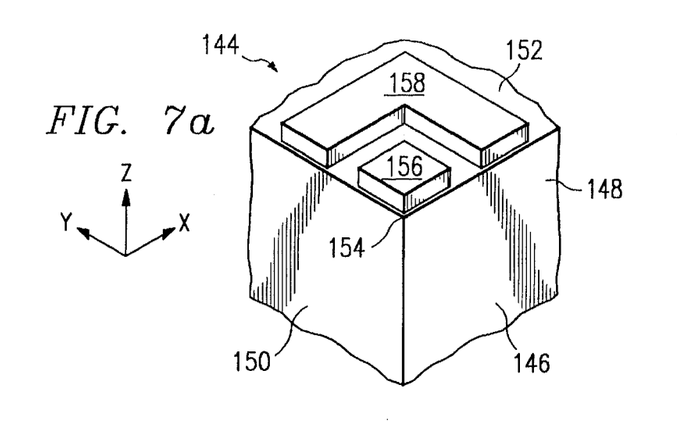
FIGS. 7a through 7d are perspective schematic illustrations of various embodiments of quantum effect devices constructed according to the teachings of the present invention.

Referring to FIG. 7a, a device 144 is illustrated which utilizes this concept. Device 144 is constructed on a substrate 146. Substrate 146 may comprise, for example, intrinsic semiconductor material such as gallium arsenide or silicon. It should be noted that FIG. 7a is not a cross-sectional diagram. Device 144 comprises a physical corner formed in a layer of semiconductor material comprising substrate 146. Suitable lithographic and anisotropic etching processes may be used to form a first side surface 148 and a second side surface 150 indicated in FIG. 7a. The remaining structures within device 144 are formed on an outer surface 152 shown in FIG. 7a. Surfaces 148, 150 and 152 meet at a corner 154. A drain contact 156 is formed proximate corner 154. Drain contact 156 may comprise, for example, any suitable conductive material such as semiconductor material which has been sufficiently doped so as to be rendered conductive or metal. An L-shaped gate conductor body 158 is formed surrounding drain conductor 156 on two sides. Gate conductor 158 may comprise similar material as drain conductor 156. The semiconductor material immediately beneath drain conductor 156 is physically isolated on two sides by side surface 148 and side surface 150. By placing a gate potential on gate conductor 158, the portions of semiconductor substrate 146 immediately beneath gate conductor 158 can be depleted of electronic carriers. This will electrically isolate the semiconductor material immediately beneath drain conductor 156 on the remaining two sides. This will have the effect of creating a quantum wire structure immediately beneath drain conductor 156. In effect, an intrinsic semiconductor substrate can be size-quantized by placing a gate potential sufficiently close to a physical barrier such as side surfaces 148 and 150.

In order for carrier quantization to occur, the distance between corner 154 and the nearest portions of gate conductor 158 should be sufficiently small such that quantization or confinement effects can occur in the semiconductor material immediately beneath drain conductor 156. For example, the distance between corner 154 and the nearest portions of gate conductor 158 should be on the order of 200 Angstroms.

FIG. 7a illustrates a homogenous semiconductor substrate 146. It should be understood that a heterostructure such as described previously comprising a quantum well layer surrounded by tunnel barrier layers could be used in place of homogenous semiconductor substrate 146. In this embodiment, the resulting device would already be quantized in the growth dimension or Z direction as shown in FIG. 7a. The placement of a gate potential on gate 158 in a device employing a heterostructure substrate would supply quantization in the remaining two dimensions to form a quantum dot beneath drain conductor 156. It should be understood that structures employing heterostructure substrates as well as homogenous semiconductor substrates are intended to be included within the scope of the present invention. Device 144 enjoys the important technical advantage that it has the ability to embody a quantum effect switching function with the use of a conventional single crystalline semiconductor substrate.

Figure 7B:
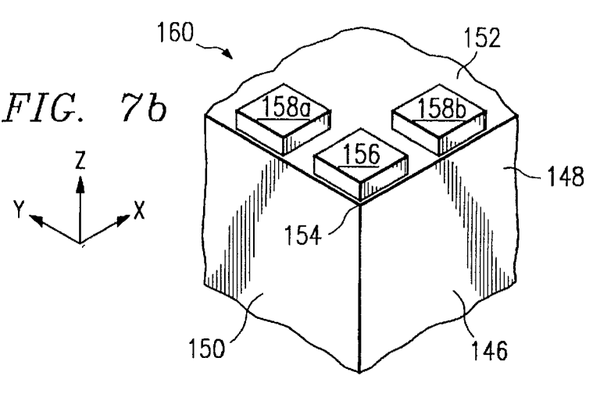

Referring to FIG. 7b, a device 160 is illustrated which is substantially similar to device 144 discussed with reference to FIG. 7a. Device 160 is similar to device 144 in that it is constructed on the outer surface 152 of a intrinsic semiconductor substrate 146 having side surfaces 148 and 150 forming a corner 154. A drain conductor 156 is placed proximate the corner 154 just as in device 144. The difference between device 160 and device 144 is that the gate conductor 158 has been separated into a first gate conductor 158a and a second gate conductor 158b, each placed proximate the drain conductor 156. Separate contact can be made to gate conductor 158a and gate conductor 158b such that device 160 can function as a two-input quantum effect logic device. The intrinsic semiconductor material immediately beneath drain conductor 156 is physically confined in the X direction by surface 150. It is similarly physically confined in the Y direction by surface 148. A placement of a potential on gate conductor 158a will electrically confine the semiconductor material immediately beneath drain conductor 156 in the remainder of the X direction. Similarly, a potential placed on gate conductor 158b will electrically deplete the region of substrate 146 immediately beneath gate conductor 158b and introduce quantum effects or confinement effects in the remainder of the Y direction. In this manner, the placement of a gate potential on both gate conductors 158a and 158b will effectively create a quantum wire bounded by surfaces 148 and 150 and the depleted regions immediately beneath gate conductor 158a and gate conductor 158b. By placing a suitable bias voltage between the substrate 146 and the drain region 156, a logic device can be implemented such that a suitable actuation voltage must be placed on both of the gates 158a and 158b before current will flow through drain conductor 156. This implementation would thereby embody a two input AND function.

Figure 7C:
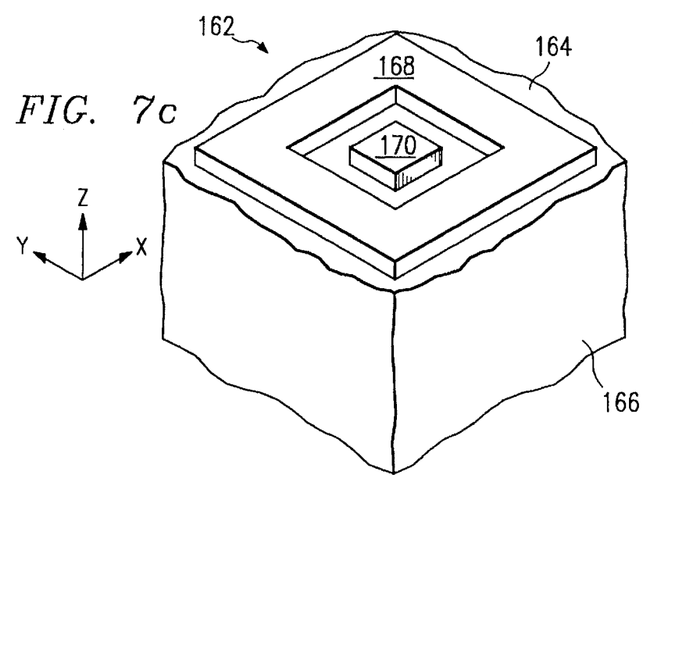

Referring to FIG. 7c, a device indicated generally at 162 is shown to be constructed on an outer surface 164 of a semiconductor substrate 166. Semiconductor substrate 166 may comprise any suitable semiconductor materials such as intrinsic gallium arsenide or silicon. A gate conductor ring 168 is formed on surface 164. A drain conductor 170 is disposed on surface 164 within gate conductor ring 168 as shown in FIG. 7c. If the inner opening of gate conductor ring 168 is on the order of 200 Angstroms in diameter, the placement of a potential on gate conductor 168 will deplete portions of substrate 166 immediately beneath gate conductor ring 168. These depletion regions will electronically form a quantum wire region immediately beneath drain conductor 170 in substrate 166. This process is closely analogous to the action of the surface depletion effects which were described with reference to FIGS. 4 and 5a previously. In the operation of device 162, however, the depletion which creates the quantum effect region immediately beneath 170 is selectively created by the placement of a potential on an annular shaped gate body such as gate ring conductor 168. Accordingly, in the operation of device 162, a quantum wire can be selectively formed without the use of the physical confinements such as surfaces 148 and 150 which were utilized in devices 144 and device 160 described with reference to FIG. 7a and 7b previously. Device 162 may be constructed on any suitable outer surface of a semiconductor material to provide a switching function of current through drain 170. Gate conductor ring 168 and drain conductor 170 may comprise any suitable conductive material such as semiconductor material which has been doped so as to be rendered conductive or metal.

Figure 7D:
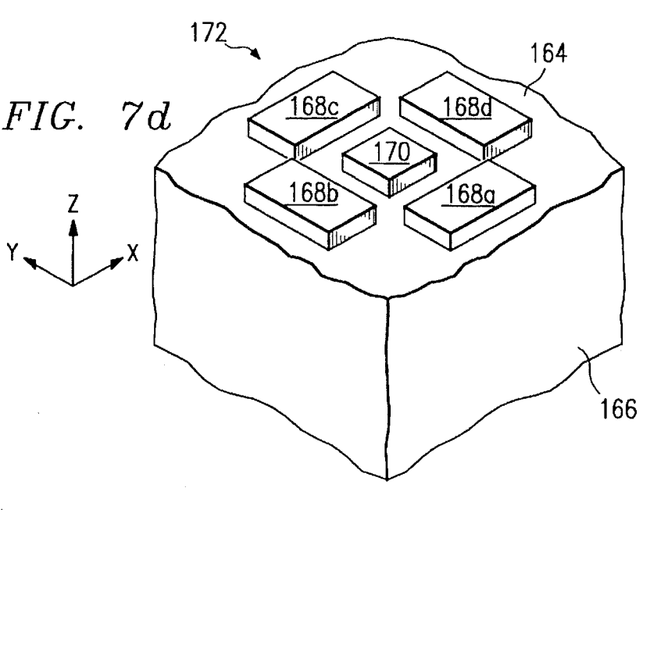

Referring to FIG. 7d, a device 172 is illustrated which is closely akin to device 162 discussed previously. Device 172 is identical to device 162 except that gate conductor ring 168 has been subdivided into four individual gate conductors 168a, 168b, 168c and 168d. Separate electrical contact can be made to each of the separate gate conductors 168a, 168b, 168c and 168d. In this manner, a logic function such as was described with reference to device 160 in FIG. 7b can be implemented as a four input AND function. By placing suitable potentials on each of gate conductors 168a, 168b, 168c and 168d, the depletion regions formed will electronically create a quantum wire region immediately beneath drain conductor 170 similar to the operation of device 162 discussed previously. By placing a suitable bias voltage between the substrate 166 and the drain conductor 170, the device 172 can be made to conduct through drain conductor 170 only when each of the gate conductors 168a through 168d have suitable potentials placed on them. It should be understood that the use of four gate conductors is merely exemplary for the purposes of teaching the present invention and should not be construed to limit the scope of the present invention to this or any embodiment. As long as the spacing between the opposing gate conductors is sufficiently small, for example, on the order of 200 Angstroms, any number of gate conductors can be utilized to implement a variety of logic functions. Further, while the logic devices described herein have been described with reference to the AND logic function, the choice of this logic function is merely for the purposes of teaching the present invention. Each of the devices described can be designed such that it will conduct in a variety of circumstances. For example, a four input logic device such as device 172 illustrated in FIG. 7d could be configured such that current would only flow through drain conductor 170 if opposing gate conductors had suitable potentials placed on them. Further, devices with large numbers of inputs could be implemented such that a majority of the inputs must be actuated in order for current to flow. Due to the flexibility of the modulation of the conduction bands through the use of quantum or confinement effects, the possible implementations of various logic functions are virtually infinite. It should be understood that all such implementations are intended to be included within the scope of the present invention.

It should be understood that devices 144, 160, 162 and 172 have been described with the gate conductors and drain conductors comprising them in direct contact with the semiconductor substrates on which they are formed. Each of devices 144, 160, 162 and 172 may be optionally implemented using the techniques described with reference to FIGS. 1a through 1g to isolate the gate conductors and drain conductor through the variety of methods described. The omission of the discussion of these methods with reference to FIGS. 7a through 7d is solely for the purposes of brevity and should not be construed to limit the teachings of the present invention to the specific embodiments described in FIGS. 7a through 7d.

Figure 8A:
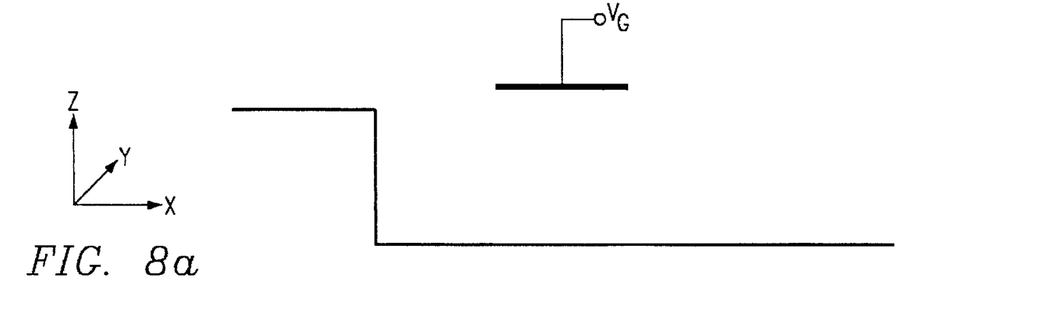
FIGS. 8a and 8b are graphical illustrations of the electronic conduction band potential of a device such as that illustrated in FIGS. 7a and 7b.
Figure 8B:
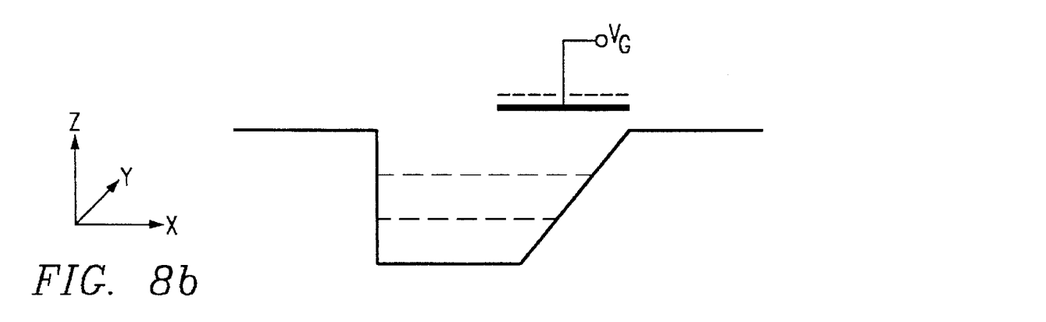

FIGS. 8a and 8b are graphical illustrations of the electronic conduction band potentials of a device such as devices 144 or 160 which contain a physical barrier which is used in conjunction with an electronically created barrier to selectively create and bound a quantum well region. FIG. 8a illustrates the electronic characteristics of, for example, device 144 when no potential is placed on gate conductor 158. The potential barrier to the left of the graphical illustration in FIG. 8a is indicative of the physical limitation of surface 150. Referring to FIG. 8b, a potential has been placed on gate conductor 158d electronically depleting the region of semiconductor substrate 146 immediately beneath gate conductor 158. The creation of this electronic barrier forms a quantum well region immediately beneath drain conductor 156 and, as shown in FIG. 8b, the presence of the conduction bands which are associated with a quantum well region which has been discussed previously.

Figure 8C:
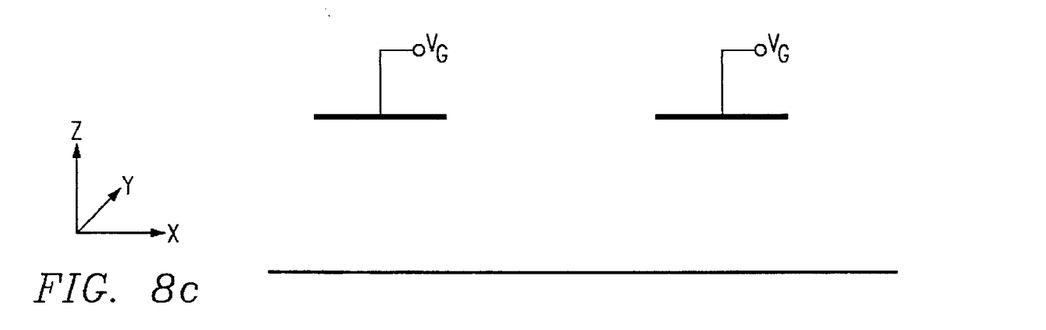
FIGS. 8c and 8d are graphical illustrations of the electronic conduction band potential of a device such as that illustrated in FIGS. 7c and 7d.

FIG. 8c is a graphical illustration of the electronic conduction band potential of a device such as device 162 discussed with reference to FIG. 7c. Device 172 does not contain the physical limitation of a surface and as such, when no potential is placed on gate conductor 168, the conduction band potential is the uniform conduction band characteristic of bulk single crystalline semiconductor material.

Figure 8D:
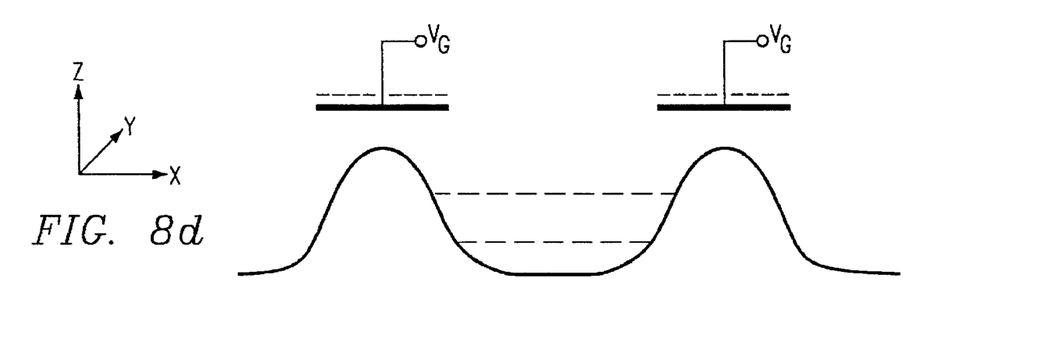

Referring to FIG. 8d, a potential has been placed on gate conductor 168 and as such, two electronic barriers have been created immediately beneath opposing portions of gate conductor 168 creating and bounding a quantum well region immediately beneath drain conductor 170 in semiconductor substrate 166. Due to the fact that the opening within which drain conductor 170 is placed is on the order of 200 Angstroms, the depletion regions formed by the placement of a potential on gate conductor 168 will give rise to the allowed conduction bands shown in FIG. 8d. As described previously with reference to FIGS. 2a through 2c and FIG. 5b, if these allowed energies correspond to the resonant tunneling potential created by the bias voltage placed on the drain conductor, the device will conduct electric current through the quantum well region created.

In accordance with the teachings of the present invention, electric potentials can be used to modulate the conduction characteristics of existing quantum regions by electrically altering the effective size-quantization dimensions of the quantum region. Further, electric potentials can be used to electrically create and bound quantum regions in conjunction with physical barriers or in effectively unbounded bulk semiconductor material. Through the use of single potentials, switching functions can be realized. Through the combination of a plurality of potentials, a variety of logic functions can be implemented.

Although the present invention has been described in detail, it should be understood that various changes, substitutions and alterations can be made hereto without departing from the spirit and scope of the invention as defined by the appended claims.

What is claimed is:

1. A quantum effect switching device comprising:

a quantum well comprising a semiconductor material and having at least one dimension sufficiently small such that quantum confinement effects manifest themselves in a conduction band associated with said quantum well;

a source and a drain on opposite sides of said quantum well in the direction of said at least one dimension; and a gate proximate a portion of said quantum well and on the same side of said quantum well as said drain and adjacent said drain, whereby a potential placed on said gate modulates said quantum well by affecting carrier quantization energy levels.

2. The device of claim 1 and further comprising:

a first tunnel barrier adjacent said quantum well;

a second tunnel barrier adjacent said quantum well and separated from said frist tunnel barrier by said quantum well;

said source electrically coupled to said second tunnel barrier; and said drain electrically coupled to said first tunnel barrier.

3. The device of claim 2 wherein said first and second tunnel barriers comprise aluminum gallium arsenide and said quantum well comprises gallium arsenide.

4. The device of claim 2 wherein said first tunnel barrier, said second tunnel barrier and said quantum well each comprise epitaxially grown layers, said quantum well having a thickness in the dimension corresponding to the epitaxial growth such that said quantum well provides quantum confinement in said growth dimension, said potential placed on said gate body operable to affect the quantum confinement of said quantum well in a dimension substantially perpendicular to said growth dimension.

5. A quantum effect switching device, comprising:

first and second quantum dot bodies disposed proximate one another in a semiconductor layer, each of said quantum dot bodies effectively providing carrier quantum confinement in each of three mutually perpendicular directions, and energy levels in said first and second quantum dot bodies coupled;

first and second tunnel barriers adjacent and separated from each other by said first quantum dot body;

third and fourth tunnel barriers adjacent and separated from each other by said second quantum dot body; and a source adjacent said first tunnel barrier opposite said first quantum dot body and a drain adjacent said second tunnel barrier opposite said first quantum dot body;

a gate contact proximate said third tunnel barrier opposite said second quantum dot body, whereby a predetermined potential placed on said gate body modulates said first and second quantum dot bodies by affecting carrier quantization energy levels.

6. The device of claim 5, wherein said first, second, third and fourth tunnel barriers and said first and second quantum dot bodies each comprise epitaxially grown layers, said quantum dot bodies having a thickness in the dimension corresponding to the direction of said epitaxial growth such that said quantum dots provide quantum confinement in said growth dimension.

7. The device of claim 5 and further comprising:

a source contact coupled to said second tunnel barrier; and a drain contact coupled to said first tunnel barrier, said predetermined potential operable to alter the level of a current flowing between said drain and source contacts.

8. The device of claim 6 wherein said first and second quantum dot bodies are each respectively disposed at the center of first and second semiconductor columns formed from said epitaxially grown layers, said first and second columns physically fused to form a figure eight-shaped double column.

9. The device of claim 6 wherein said second and fourth tunnel barriers are formed in a first layer of epitaxially grown aluminum gallium arsenide and said first and third tunnel barriers are formed in a second layer of epitaxially grown aluminum gallium arsenide.

10. The device of claim 6 wherein said first and second quantum dot bodies are formed in a layer of epitaxially grown gallium arsenide.

11. The device of claim 8 wherein said semiconductor columns each comprise a predetermined concentration of impurities such that surface depletion effects associated with the outer surfaces of said columns provide for the effective quantization of electron states in said first and second quantum dot bodies in the to remaining dimensions other than said growth dimension.

12. A method of regulating current resonantly tunneling through a quantum well comprising the steps of:

applying a biasing voltage across the quantum well; and electrically modulating the energy levels of the quantum well by applying an electric field to a selected portion which is less than all of the quantum well to adjust the potential depth of said quantum well portion.

13. The method of claim 12 wherein said step of modulating comprises the step of placing a predetermined potential on a gate conductor insulatively disposed proximate the quantum well.

* * * * *